(12) United States Patent
Wu et al.

(10) Patent No.: US 7,612,374 B2
(45) Date of Patent: Nov. 3, 2009

(54) TFT CONTAINING COALESCED NANOPARTICLES

(75) Inventors: Yiliang Wu, Mississauga (CA); Yuning Li, Mississauga (CA); Beng S Ong, Singapore (SG)

(73) Assignee: Xerox Corporation, Norwalk, CT (US)

( * ) Notice: Subject to any disclaimer, the term of this patent is extended or adjusted under 35 U.S.C. 154(b) by 5 days.

(21) Appl. No.: 11/954,736

(22) Filed: Dec. 12, 2007

(65) Prior Publication Data

US 2008/0135937 A1 Jun. 12, 2008

Related U.S. Application Data

(62) Division of application No. 11/265,935, filed on Nov. 3, 2005, now Pat. No. 7,443,027, which is a division of application No. 10/733,136, filed on Dec. 11, 2003, now abandoned.

(51) Int. Cl.
*H01L 29/04* (2006.01)
*H01L 29/08* (2006.01)
*H01L 29/10* (2006.01)

(52) U.S. Cl. .............................. 257/60; 257/40; 257/57; 257/66

(58) Field of Classification Search .................. 257/40, 257/57, 60, 66, E29.117, E29.151, E29.273
See application file for complete search history.

(56) References Cited

U.S. PATENT DOCUMENTS

| | | | |
|---|---|---|---|
| 5,147,841 A | 9/1992 | Wilcoxon | |
| 5,262,357 A | 11/1993 | Alivisatos et al. | |
| 5,882,722 A | 3/1999 | Kydd | |
| 6,103,868 A | 8/2000 | Heath et al. | |
| 6,126,740 A | 10/2000 | Schulz et al. | |
| 6,262,129 B1 | 7/2001 | Murray et al. | |
| 6,348,295 B1 | 2/2002 | Griffith et al. | |
| 6,458,327 B1 | 10/2002 | Vossmeyer | |
| 6,572,673 B2 | 6/2003 | Lee et al. | |
| 6,586,787 B1 | 7/2003 | Shih et al. | |

(Continued)

FOREIGN PATENT DOCUMENTS

WO WO 01/53007 A1 7/2001

OTHER PUBLICATIONS

Douglas L. Schulz et al., "CdTe Thin Films from Nanoparticle Precursors by Spray Deposiition," vol. 9, No. 4, *Chem. Mater.*, pp. 889-900 (1997).

(Continued)

*Primary Examiner*—Hung Vu
(74) *Attorney, Agent, or Firm*—Fay Sharpe LLP

(57) ABSTRACT

A thin film transistor comprising: (a) an insulating layer; (b) a gate electrode; (c) a semiconductor layer; (d) a source electrode; and (e) a drain electrode, wherein the insulating layer, the gate electrode, the semiconductor layer, the source electrode, and the drain electrode are in any sequence as long as the gate electrode and the semiconductor layer both contact the insulating layer, and the source electrode and the drain electrode both contact the semiconductor layer, and wherein at least one of the source electrode, the drain electrode, and the gate electrode comprise coalesced coinage metal containing nanoparticles and a residual amount of one or both of a stabilizer covalently bonded to the coalesced coinage metal containing nanoparticles and a decomposed stabilizer covalently bonded to the coalesced coinage metal containing nanoparticles.

4 Claims, 2 Drawing Sheets

U.S. PATENT DOCUMENTS

| | | | |
|---|---|---|---|
| 6,688,494 | B2 | 2/2004 | Pozarnsky et al. |
| 6,875,717 | B2 | 4/2005 | Lugmair et al. |
| 7,078,276 | B1 * | 7/2006 | Zurcher et al. ............. 438/151 |
| 7,193,237 | B2 * | 3/2007 | Aramaki et al. ............. 257/40 |
| 7,270,694 | B2 | 9/2007 | Li et al. |
| 2002/0034675 | A1 | 3/2002 | Starz et al. |
| 2003/0077625 | A1 | 4/2003 | Hutchison |
| 2003/0180451 | A1 | 9/2003 | Kodas et al. |
| 2004/0004209 | A1 | 1/2004 | Matsuba et al. |
| 2004/0086444 | A1 | 5/2004 | Green |
| 2004/0180988 | A1 | 9/2004 | Bernius et al. |
| 2005/0056828 | A1 | 3/2005 | Wada et al. |

OTHER PUBLICATIONS

M. Brust et al., "Synthesis and Reactions of Functionalised Gold Nanoparticles," *J. Chem. Soc., Chem. Commun.*, pp. 1655-1656 (1995).

Toshiharu Teranishi et al., "Heat-Induced Size Evolution of Gold Nanoparticles in the Solid State," vol. 13, No. 22, *Adv. Mater.*, pp. 1699-1701 (2001).

Francis P. Zamborini et al., "Electron Hopping Conductivity and Vapor Sensing Properties of Flexible Network Polymer Films of Metal Nanoparticles," vol. 124, No. 30, *J. Am. Chem. Soc.*, pp. 8958-8964 (2002).

D. Huang et al., "Plastic-Compatible Low Resistance Printable Gold Nanoparticle Conductors for Flexible Electronics", *Journal of The Electrochemical Society*, vol. 150, No. 7, pp. G412-G417 (2003).

C. A. Bulthaup et al., "All-additive fabrication of inorganic logic elements by liquid embossing", *Applied Physics Letters*, vol. 79, No. 10, pp. 1525-1527 (Sep. 3, 2001).

G. Blanchet and J. Rodgers, "Printed Techniques for Plastic Electronics", *Journal of Imaging Science and Technology*, vol. 47, No. 4, pp. 296-303 (Jul./Aug. 2003).

P. Buffat and J-P. Borel, "Size effect on the melting temperature of gold particles", *Physical Review A*, vol. 13, No. 6, pp. 2287-2298 (Jun. 1976).

C. Hayashi, "Ultrafine Particles", *J. Vacuum Sci. Technol. A*, vol. 5, No. 4, pp. 1375-1384 (Jul./Aug. 1987).

S. B. Fuller, E. J. Wilhelm, and J. M. Jacobson, "Ink-Jet Printed Nanoparticle Microelectromechanical Systems", *Journal of Microelectromechanical Systems*, vol. 11, No. 1, pp. 54-60 (Feb. 2002).

X. Z. Lin, X. Teng, and H. Yang, "Direct Synthesis of Narrowly Dispersed Silver Nanoparticles Using a Single-Source Precursor", *Langmuir*, vol. 19, pp. 10081-10085 (published on web Nov. 1, 2003).

H. Hiramatsu and F. E. Osterloh, "A Simple Large-Scale Synthesis of Nearly Monodisperse Gold and Silver Nanoparticles with Adjustable Sizes and with Exchangeable Surfactants", *Chem. Mater.*, vol. 16, No. 13, pp. 2509-2511 (Jun. 29, 2004; published on web May 28, 2004).

* cited by examiner

TFT CONTAINING COALESCED NANOPARTICLES

CROSS-REFERENCE TO RELATED APPLICATIONS

This application is a divisional application of co-pending U.S. application Ser. No. 11/265,935, filing date Nov. 3, 2005, from which priority is claimed, the disclosure of which is totally incorporated herein by reference.

U.S. application Ser. No. 11/265,935 is a divisional application of U.S. application Ser. No. 10/733,136 (filing date Dec. 11, 2003) from which priority is claimed, the disclosure of which is totally incorporated herein by reference.

Yiliang Wu et al., U.S. application Ser. No. 11/954,698, titled "NANOPARTICLES WITH COVALENTLY BONDED STABILIZER," filed on the same day as the present divisional application, is a divisional application of co-pending U.S. application Ser. No. 11/265,935, filing date Nov. 3, 2005, from which priority is claimed, the disclosure of which is totally incorporated herein by reference.

STATEMENT REGARDING FEDERALLY SPONSORED RESEARCH OR DEVELOPMENT

This invention was made with United States Government support under Cooperative Agreement No. 70NANBOH3033 awarded by the National Institute of Standards and Technology (NIST). The United States Government has certain rights in the invention.

BACKGROUND OF THE INVENTION

The proper deposition and patterning of electrically conductive materials as for instance electrodes and interconnects are important in circuit fabrication for electronic devices. Electrodes of electronic devices such as thin film transistors can be fabricated, for example, by vacuum deposition of a metal through a shadow mask, or by vacuum deposition of a metal and subsequent patterning with photolithography technique. However, vacuum deposition and photolithography are costly techniques. They are not suitable for use in manufacturing low-cost large-area electronics, particularly plastic electronics. Manufacturing cost can be significantly reduced if the electrodes and interconnects could be directly deposited and patterned by solution depositing. In addition, although organic electrically conductive materials such as polystyrene sulfonate-doped poly(3,4-ethylenedioxythiophene) ("PSS-PEDOT") are solution processable, metal is preferred over organic conductive materials in certain situations due to metal's higher conductivity and the potential long-term operational stability of metal electrodes and interconnects. Therefore, there is a need, addressed by embodiments of the present invention, for new processes to form the electrically conductive layer of an electronic device.

The following documents may be relevant to examination of the present application:

Alivisatos et al., U.S. Pat. No. 5,262,357.
International Publication Number WO 01/53007 A1.
Douglas L. Schulz et al., "CdTe Thin Films from Nanoparticle Precursors by Spray Deposition," Vol. 9, No. 4, *Chem. Mater.*, pp. 889-900 (1997).
Vossmeyer, U.S. Pat. No. 6,458,327 B1.
Shih et al., U.S. Pat. No. 6,586,787 B1.
M. Brust et al., "Synthesis and Reactions of Functionalised Gold Nanoparticles," *J. Chem. Soc., Chem. Commun.*, pp. 1655-1656 (1995).
Heath et al., U.S. Pat. No. 6,103,868.
Toshiharu Teranishi et al., "Heat-Induced Size Evolution of Gold Nanoparticles in the Solid State," Vol. 13, No. 22, *Adv. Mater.*, pp. 1699-1701 (2001).
Francis P. Zamborini et al., "Electron Hopping Conductivity and Vapor Sensing Properties of Flexible Network Polymer Films of Metal Nanoparticles," Vol. 124, No. 30, *J. Am. Chem. Soc.*, pp. 8958-8964 (2002).

SUMMARY OF THE DISCLOSURE

In embodiments, there is provided a process comprising:

(a) solution depositing a composition comprising a liquid and a plurality of metal nanoparticles with a stabilizer on a substrate to result in a deposited composition; and (b) heating the deposited composition to cause the metal nanoparticles to form an electrically conductive layer of an electronic device, wherein one or more of the liquid, the stabilizer, and a decomposed stabilizer is optionally part of the electrically conductive layer but if present is in a residual amount.

In additional embodiments, there is provided a process comprising:

(a) solution printing a composition comprising a liquid and a plurality of coinage metal containing nanoparticles with a stabilizer on a plastic substrate to result in a deposited composition; and (b) heating the deposited composition to cause the coinage metal containing nanoparticles to coalesce to form an electrically conductive layer of an electronic device, wherein one or more of the liquid, the stabilizer, and a decomposed stabilizer is optionally part of the electrically conductive layer but if present is in a residual amount.

In embodiments, there is also provided an apparatus comprising:

(a) a substrate (b) a deposited composition comprising a liquid and a plurality of metal nanoparticles with a covalently bonded stabilizer.

In further embodiments, there is provided an electronic device comprising:

(a) a substrate (b) an electrically conductive layer comprising coalesced metal nanoparticles and a residual amount of one or both of a stabilizer and a decomposed stabilizer as part of the electrically conductive layer.

In other embodiments, there is provided a thin film transistor comprising:

(a) an insulating layer;

(b) a gate electrode;

(c) a semiconductor layer;

(d) a source electrode; and (e) a drain electrode, wherein the insulating layer, the gate electrode, the semiconductor layer, the source electrode, and the drain electrode are in any sequence as long as the gate electrode and the semiconductor layer both contact the insulating layer, and the source electrode and the drain electrode both contact the semiconductor layer, and wherein at least one of the source electrode, the drain electrode, and the gate electrode comprise coalesced coinage metal containing nanoparticles and a residual amount of one or both of a stabilizer and a decomposed stabilizer.

BRIEF DESCRIPTION OF THE DRAWINGS

Other aspects of the present invention will become apparent as the following description proceeds and upon reference to the Figures which represent illustrative embodiments.

Unless otherwise noted, the same reference numeral in different Figures refers to the same or similar feature.

DETAILED DESCRIPTION

Figure 1:
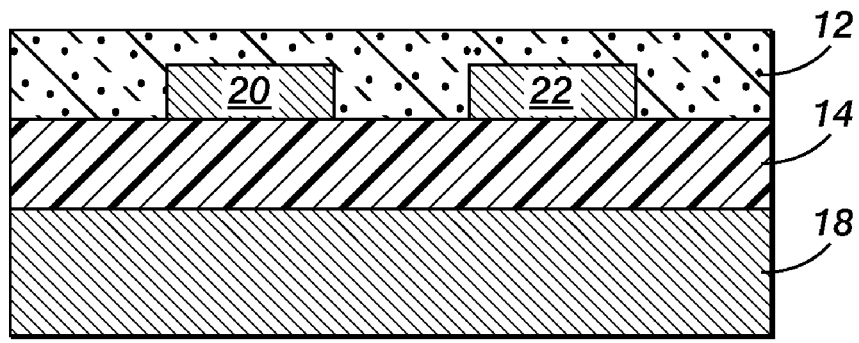
FIG. 1 represents a first embodiment of a thin film transistor made using the present process.

The term "nanoparticles" as used herein refers to particles with an average size of less than about 1 micrometer, less than about 100 nm, or less than about 10 nm. In embodiments, the particle size of the nanoparticles ranges for example from about 1 nm to about 100 nm or from about 1 nm to about 50 nm, or from about 1 nm to about 10 nm. The particle size is defined herein as the average diameter of metal core, excluding the stabilizer.

Any materials are suitable for the metal nanoparticles as long as the metal nanoparticles are capable of forming an electrically conductive layer of an electronic device. The metal nanoparticles are composed of a single metal or of a metal composite composed of (i) two or more metals in an equal or unequal ratio, or (ii) at least one metal with one or more non-metals in an equal or unequal ratio. Suitable metals for the metal nanoparticles include for example Al, Au, Ag, Pt, Pd, Cu, Co, Cr, In, and Ni, particularly the transition metals for example Au, Ag, Pt, Pd, Cu, Cr, Ni, and mixtures thereof. Exemplary metal composites are Au—Ag, Au—Cu, Ag—Cu, Au—Ag—Cu, and Au—Ag—Pd. Suitable non-metals in the metal composite include for example Si, C, N, and O. In embodiments, metal nanoparticles are composed of a single coinage metal or of a metal composite containing one or more coinage metals. The term "coinage metal" refers to Au, Ag, and Cu. Each component of a metal composite may be present in an amount ranging for example from about 0.01% to about 99.9% by weight, particularly from about 10% to about 90% by weight.

Suitable materials for the metal nanoparticles may be selected in embodiments based on for example high conductivity, preferably about or more than 100 S/cm when such material is coated as a thin film with a thickness ranging for example from 5 nanometers to 1 micrometer, and optionally also based on long term stability in air. Prior to heating, the metal nanoparticles may or may not exhibit high electrical conductivity.

The stabilizer may be any moiety that "stabilizes" the metal nanoparticles in the liquid prior to the solution depositing, where "stabilizes" refers to reducing the aggregation and precipitation of the metal nanoparticles in the liquid prior to solution depositing. Preferred stabilizers are those that "stabilize" the metal nanoparticles in the liquid at room temperature (which refers herein to a temperature of about 20 to about 28 degrees C.) or any other desired temperature range. The stabilizer may be a single stabilizer or a mixture of two or more stabilizers. In embodiments, the stabilizer has a boiling point or decomposition temperature lower than about 250 degree C., particularly lower than about 150 degree C., under 1 atmosphere or reduced pressure for example from several mbar to about $10^{-3}$ mbar.

In embodiments, the stabilizer may be an organic stabilizer. The term "organic" in "organic stabilizer" refers to the presence of carbon atom(s), but the organic stabilizer may include one or more non-metal heteroatoms such as nitrogen, oxygen, sulfur, silicon, a halogen, and the like. Exemplary organic stabilizers include for instance thiol and its derivatives, amine and its derivatives, carboxylic acid and its carboxylate derivatives, polyethylene glycols, and other organic surfactants. In embodiments, the organic stabilizer is selected from the group consisting of a dithiol such as for example 1,2-ethanedithiol, 1,3-propanedithiol, and 1,4-butanedithiol; a diamine such as for example ethylenediamine, 1,3-diaminopropane, 1,4-diaminobutane; a thiol such as for example 1-butanethiol, 1-pentanethiol, 1-hexanethiol, 1-heptanethiol, 1-octanethiol, 1-dodecanethiol, and tert-dodecanethiol; an amine such as for example 1-ethylamine, 1-propylamine, 1-butylamine, octylamine and dodecylamine; a mixture of a thiol and a dithiol; and a mixture of an amine and a diamine, particularly a low boiling point version of any of the above. Organic stabilizers containing a pyridine derivative (e.g., dodecyl pyridine) and/or organophosphine that can stabilize metal nanoparticles are also included as a stabilizer in embodiments of the present invention. In embodiments, the metal nanoparticles may form a chemical bond with the stabilizer. The chemical names of the stabilizer provided herein are before formation of any chemical bond with the metal nanoparticles. It is noted that the chemical name of the stabilizer may change with the formation of a chemical bond, but for convenience the chemical name prior to formation of the chemical bond is used.

In embodiments, the stabilizer can be a metal containing stabilizer such as organometallic compounds or metal salts of organic compounds. Illustrative examples are metal alkoxides, metal carboxylates, alkyl ammonium salts of metal, and other metal containing compounds such as a metal alkylsulfonate or arylsulfonate, and a pyridynium salt of metal, or mixtures thereof. The metal of the metal containing stabilizer can be for example sodium, potassium, and calcium. In embodiments of the present invention, the metal containing stabilizer is other than a metal-chelate complex. In embodiments of the present invention, the stabilizer is other than a metal containing stabilizer.

The attractive force between the metal nanoparticles and the stabilizer can be a chemical bond and/or physical attachment. The chemical bond can take the form of for example covalent bonding, hydrogen bonding, coordination complex bonding, or ionic bonding, or a mixture of different chemical bonds. The physical attachment can take the form of for example van der waals' forces or dipole-dipole interaction, or a mixture of different physical attachments. In embodiments, the attractive force may be bonding via for example a sulfur-metal bonding or coordination complex bonding. In other embodiments, the attractive force can be a non-covalent, non-ionic bonding such as van der waals' forces, hydrogen bonding, or a mixture of thereof.

The extent of coverage of the stabilizer on the surface of the metal nanoparticles can vary for example from partial to full coverage depending for instance on the capability of the stabilizer to stabilize the metal nanoparticles in the liquid. Of course, there is variability as well in the extent of coverage of the stabilizer among the individual metal nanoparticles.

Any suitable method may be used to form metal nanoparticles with stabilizers. One such method is simultaneous reduction of metal compound and attachment of the stabilizer to the growing metal nuclei. Metal nanoparticles with a stabilizer and their preparation are described in M. Brust, "Synthesis and Reactions of Functionalised Gold Nanoparticles," *J. Chem. Soc., Chem. Commun.*, pp. 1655-1656 (1995) and Heath et al., U.S. Pat. No. 6,103,868, the disclosures of which are totally incorporated herein by reference.

In embodiments, the composition prior to solution depositing and the resulting deposited composition prior to the heating generally have the same components but may differ in their concentrations (or may have the same component concentrations) where for example the liquid concentration may be lower in the deposited composition. Unless otherwise noted, any discussion of the composition relates to the composition prior to solution depositing. The phrase "deposited composition" is used to distinguish from the composition prior to solution depositing. The composition (referred herein as "Composition") can be either a solution or a dispersion. Any suitable technique may be used to prepare the Composition. In embodiments, the Composition can be prepared simply by dissolving or dispersing the metal nanoparticles with the stabilizer in a suitable liquid. Ultrasonic and mechanical stirring are optionally used to assist the dissolving or dispersing of the metal nanoparticles.

Exemplary amounts of the Composition components are as follows. The metal nanoparticles and the stabilizer are present in an amount ranging for example from about 0.3% to about 90% by weight, or from about 1% to about 70% by weight, the balance being the other components of the Composition such as the liquid. If the metal nanoparticles and the stabilizer(s) are added separately into the liquid, the metal nanoparticles are present in an amount ranging for example from about 0.1% to 90% by weight, or from about 1% to 70% by weight of the Composition; the stabilizer or stabilizers are present in a sufficient amount to form a stable Composition, for example in a range from about 1% to 50% by weight, or from about 5% to 40% by weight of the Composition.

Examples of the liquid are water, ketones, alcohols, esters, ethers, halogenated aliphatic and aromatic hydrocarbons and the like and mixtures thereof. Specific liquid examples are cyclohexanone, acetone, methyl ethyl ketone, methanol, ethanol, butanol, amyl alcohol, butyl acetate, dibutyl ether, tetrahydrofuran, toluene, xylene, chlorobenzene, methylene chloride, trichloroethylene, and the like. A single material or a mixture of two, three or more different materials can be used for the liquid at any suitable ratio such as an equal or unequal ratio of two or more different fluids.

The Composition may be solution deposited on the substrate at any suitable time prior to or subsequent to the formation of any other layer or layers on the substrate. Thus, solution depositing of the Composition "on the substrate" can occur either on a "bare" substrate or on a substrate already containing layered material (e.g., a semiconductor layer and/or an insulating layer).

The phrase "solution depositing" refers to any suitable solution compatible (or dispersion compatible) deposition technique such as solution coating and solution printing. Illustrative solution coating processes include for example spin coating, blade coating, rod coating, dip coating, and the like. Illustrative solution printing techniques include for example screen printing, stencil printing, inkjet printing, stamping (such as microcontact printing), and the like. The solution depositing deposits a layer of the deposited composition having a thickness ranging from about 5 nm to about 1 millimeter, particularly from about 10 nm to 1 micrometer.

After solution depositing, the deposited composition is subjected to heating for a time ranging for example from about 5 minutes to about 10 hours, particularly from about 0.5 hour to about 5 hours. The heating temperature preferably is one that does not cause adverse changes in the properties of previously deposited layer(s) or the substrate (whether single layer substrate or multilayer substrate). The heating temperature may be for example from about 50 to about 250 degrees C., particularly from about 50 to about 150 degrees C.

Heating produces a number of effects. One desired effect is to cause the metal nanoparticles to form the electrically conductive layer. In embodiments, the heating causes the metal nanoparticles to coalesce to form an electrically conductive layer. In other embodiments, it may be possible that the metal nanoparticles achieve particle-to-particle contact to form the electrically conductive layer without coalescing where, although there may be grain boundaries between the contacting metal nanoparticles, electrons can still tunnel through the boundaries leading to current flow.

Heating may cause separation of the stabilizer and the liquid from the metal nanoparticles in the sense that the stabilizer and the liquid are generally not incorporated into the electrically conductive layer but if present are in a residual amount. In embodiments, heating may decompose a portion of the stabilizer to produce "decomposed stabilizer." Heating may also cause separation of the decomposed stabilizer such that the decomposed stabilizer generally is not incorporated into the electrically conductive layer, but if present is in a residual amount. Separation of the stabilizer, the liquid, and the decomposed stabilizer from the metal nanoparticles may lead to enhanced electrical conductivity of the electrically conductive layer since the presence of these components may reduce the extent of metal nanoparticle to metal nanoparticle contact or coalescence. Separation may occur in any manner such as for example a change in state of matter from a solid or liquid to a gas, e.g., volatilization. Separation may also occur when any one or more of the stabilizer, decomposed stabilizer, and liquid migrates to an adjacent layer and/or forms an interlayer between the electrically conductive layer and the adjacent layer, where intermixing of various materials optionally occurs in the adjacent layer and/or the interlayer.

In embodiments, one or more of the stabilizer, decomposed stabilizer, and the liquid is absent from the electrically conductive layer. In embodiments, a residual amount of one or more of the stabilizer, decomposed stabilizer, and the liquid may be present in the electrically conductive layer, where the residual amount does not appreciably affect the conductivity of the electrically conductive layer. In embodiments, the residual amount of one or more of the stabilizer, decomposed stabilizer, and the liquid may decrease the conductivity of the electrically conductive layer but the resulting conductivity is still within the useful range for the intended electronic device. The residual amount of each component may independently range for example of up to about 5% by weight, or less than about 0.5% by weight based on the weight of the electrically conductive layer, depending on the process conditions such as heating temperature and time. When heating causes separation of the stabilizer and/or decomposed stabilizer from the metal nanoparticles, the attractive force between the separated stabilizer/decomposed stabilizer and the metal nanoparticles is severed or diminished. Other techniques such as exposure to UV light may be combined with heating to accelerate the separation of the stabilizer, the liquid, and the decomposed stabilizer from the metal nanoparticles.

After heating, the resulting electrically conductive layer is optionally cooled down to room temperature for subsequent processing such as for example the deposition of a semiconductor layer.

In embodiments, after heating, the resulting electrically conductive layer consists of or consists essentially of coalesced metal nanoparticles or uncoalesced contacting metal nanoparticles. The resulting electrically conductive layer has a thickness ranging for example from about 5 nm to about 10 micrometer, particularly from 20 nanometers to 1,000 nanometers. In embodiments, the electrically conductive layer has a thin film conductivity of for example more than about 0.1 S/cm (Siemens/centimeter), particularly more than about 10 S/cm. In embodiments, the conductivity of the resulting electrically conductive layer is more than about 100 S/cm, particularly more than about 500 S/cm. The conductivity was measured by traditional four-probe measurement technique.

In embodiments, the present process may be used whenever there is a need to form an electrically conductive layer in an electronic device. The electrically conductive layer may be for example an electrode, conducting lines, or interconnects. The phrase "electronic device" refers to macro-, micro- and nano-electronic devices such as, for example, antenna(s) in radio frequency identification tags, micro- and nano-sized transistors and diodes. Illustrative transistors include for instance thin film transistors, particularly organic thin film transistors.

In FIG. 1, there is schematically illustrated a thin film transistor ("TFT") configuration 10 comprised of a heavily n-doped silicon wafer 18 which acts as both a substrate and a gate electrode, a thermally grown silicon oxide insulating layer 14 on top of which two metal contacts, source electrode 20 and drain electrode 22, are deposited. Over and between the metal contacts 20 and 22 is an organic semiconductor layer 12 as illustrated herein. An optional encapsulation layer (not shown) contacts the semiconductor layer. The encapsulation layer may be composed of for example an inorganic material such as silicon oxide, silicon nitride, aluminum oxide, glass; an organic material such as polyimides, polyesters, poly(acrylate)s, epoxy resin; and a mixture of inorganic and organic materials.

Figure 2:
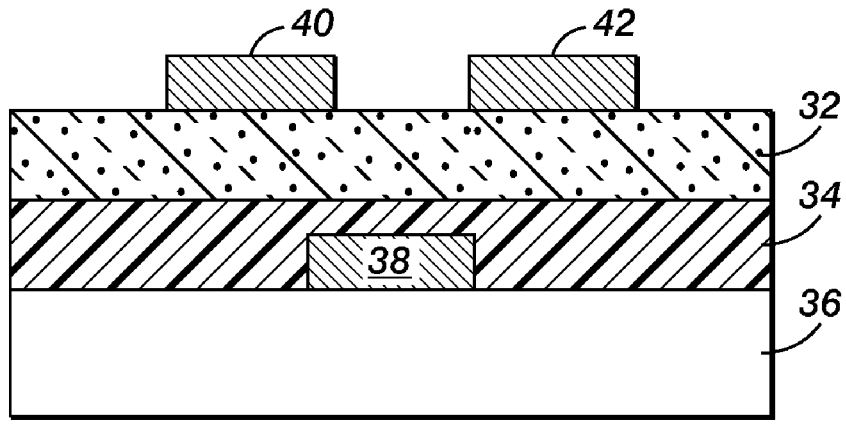
FIG. 2 represents a second embodiment of a thin film transistor made using the present process.

FIG. 2 schematically illustrates another TFT configuration 30 comprised of a substrate 36, a gate electrode 38, a source electrode 40 and a drain electrode 42, an insulating layer 34, and an organic semiconductor layer 32.

Figure 3:
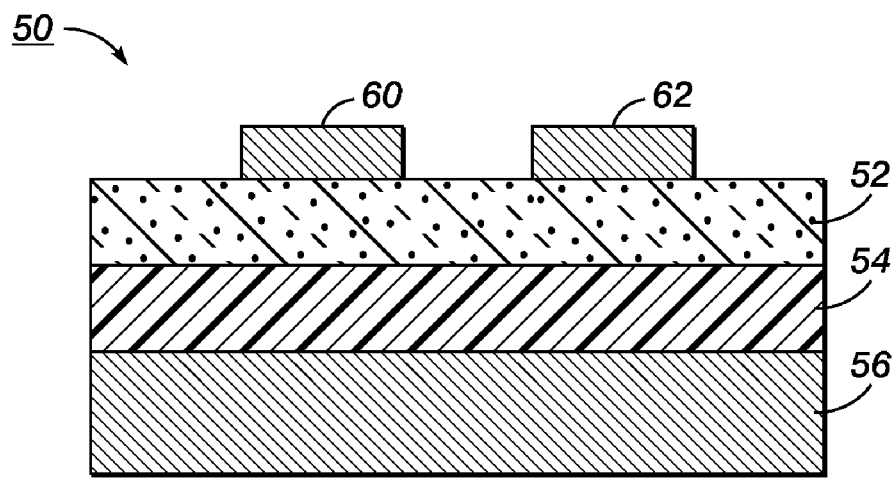
FIG. 3 represents a third embodiment of a thin film transistor made using the present process.

FIG. 3 schematically illustrates a further TFT configuration 50 comprised of a heavily n-doped silicon wafer 56 which acts as both a substrate and a gate electrode, a thermally grown silicon oxide insulating layer 54, and an organic semiconductor layer 52, on top of which are deposited a source electrode 60 and a drain electrode 62.

Figure 4:
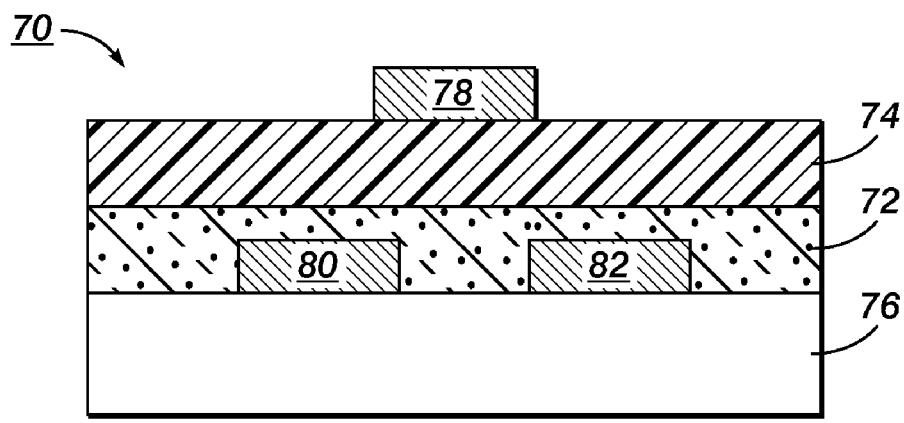
FIG. 4 represents a fourth embodiment of a thin film transistor made using the present process.

FIG. 4 schematically illustrates an additional TFT configuration 70 comprised of substrate 76, a gate electrode 78, a source electrode 80, a drain electrode 82, an organic semiconductor layer 72, and an insulating layer 74.

The substrate may be composed of for instance silicon wafer, glass plate, metal sheet, plastic film or sheet. For structurally flexible devices, plastic substrate, such as for example polyester, polycarbonate, polyimide sheets and the like may be used. The thickness of the substrate may be from amount 10 micrometers to over 10 millimeters with an exemplary thickness being from about 50 micrometers to about 2 millimeters, especially for a flexible plastic substrate and from about 0.4 to about 10 millimeters for a rigid substrate such as glass or silicon.

The gate electrode, the source electrode, and the drain electrode are fabricated by embodiments of the present invention. The thickness of the gate electrode layer ranges for example from about 10 to about 2000 nanometers. Typical thicknesses of source and drain electrodes are about, for example, from about 40 nanometers to about 1 micrometer with the more specific thickness being about 60 to about 400 nanometers.

The insulating layer generally can be an inorganic material film or an organic polymer film. Illustrative examples of inorganic materials suitable as the insulating layer include silicon oxide, silicon nitride, aluminum oxide, barium titanate, barium zirconium titanate and the like; illustrative examples of organic polymers for the insulating layer include polyesters, polycarbonates, poly(vinyl phenol), polyimides, polystyrene, poly(methacrylate)s, poly(acrylate)s, epoxy resin, liquid glass, and the like. The thickness of the insulating layer is, for example from about 10 nanometers to about 500 nanometers depending on the dielectric constant of the dielectric material used. An exemplary thickness of the insulating layer is from about 100 nanometers to about 500 nanometers. The insulating layer may have a conductivity that is for example less than about $10^{-12}$ S/cm.

Situated, for example, between and in contact with the insulating layer and the source/drain electrodes is the semiconductor layer wherein the thickness of the semiconductor layer is generally, for example, about 10 nanometers to about 1 micrometer, or about 40 to about 100 nanometers. Any semiconductor material may be used to form this layer. Exemplary semiconductor materials include regioregular polythiophene, oligthiophene, pentacene, and the semiconductor polymers disclosed in Beng Ong et al., US Patent Application Publication No. US 2003/0160230 A1; Beng Ong et al., US Patent Application Publication No. US 2003/0160234 A1; Beng Ong et al., US Patent Application Publication No. US 2003/0136958 A1; and "Organic Thin Film Transistors for Large Area Electronics" by C. D. Dimitrakopoulos and P. R. L. Malenfant, *Adv. Mater.*, Vol. 12, No. 2, pp. 99-117 (2002), the disclosures of which are totally incorporated herein by reference. Any suitable technique may be used to form the semiconductor layer. One such method is to apply a vacuum of about $10^{-5}$ to $10^{-7}$ torr to a chamber containing a substrate and a source vessel that holds the compound in powdered form. Heat the vessel until the compound sublimes onto the substrate. The semiconductor layer can also generally be fabricated by solution processes such as spin coating, casting, screen printing, stamping, or jet printing of a solution or dispersion of the semiconductor.

The insulating layer, the gate electrode, the semiconductor layer, the source electrode, and the drain electrode are formed in any sequence, particularly where in embodiments the gate electrode and the semiconductor layer both contact the insulating layer, and the source electrode and the drain electrode both contact the semiconductor layer. The phrase "in any sequence" includes sequential and simultaneous formation. For example, the source electrode and the drain electrode can be formed simultaneously or sequentially. The composition, fabrication, and operation of thin film transistors are described in Bao et al., U.S. Pat. No. 6,107,117, the disclosure of which is totally incorporated herein by reference.

The thin film transistors produced by the present process have an on/off ratio greater than for example about $10^2$, and particularly greater than about $10^3$. The phrase on/off ratio refers to the ratio of the source-drain current when the transistor is on to the source-drain current when the transistor is off.

In embodiments, the benefits of the present invention may include one or more of the following:

(1) The metal nanoparticles, can form a stable dispersion in liquid media, which enables a solution deposition technique. These solution deposition techniques lower manufacturing cost significantly, particularly for a large area device.

(2) Compared with using an organic conductive material for the electrically conductive layer, fabricating an electrically conductive layer from the metal nanoparticles results in higher conductivity and better long-term stability.

(3) Compared with the use of larger metal particles, the metal nanoparticles can be heated to form the electrically conductive layer at a lower temperature. Lower temperatures enable fabrication of transistor circuits on plastic substrates for plastic electronic applications at a lower cost.

The invention will now be described in detail with respect to specific exemplary embodiments thereof, it being understood that these examples are intended to be illustrative only and the invention is not intended to be limited to the materials, conditions, or process parameters recited herein. All percentages and parts are by weight unless otherwise indicated.

EXAMPLE 1

Preparation of Gold Nanoparticles with an Alkanethiol Stabilizer

To a tetraoctylammonium bromide (2.19 g, 4 mmol) solution in toluene (80 mL) in a 500 mL flask was added hydrogen tetrachloroaurate (III) trihydrate (0.394 g, 1 mmol) solution in water (100 mL) with rapid stirring (under argon). After two minutes, 1-octanethiol (0.439 g, 3 mmol) in toluene (30 mL) was added to the flask and stirred vigorously for 10 min at room temperature until the solution became colorless. Then the solution was cooled to 0° C. by an ice-water bath. A freshly prepared sodium borohydride (0.378 g, 10 mmol) solution in water (100 mL) was added to the vigorously stirred solution over 30 seconds. The reaction mixture was allowed to warm to room temperature and the rapid stirring was continued for 3 h. The organic phase was separated and concentrated to 5 mL by evaporation of the solvent (the bath temperature is <40° C.). The concentrated solution was added drop-wise to 200 mL rapidly stirring methanol. The product was collected by centrifugation, washed with methanol several times, and vacuum dried. The solid was dissolved in a small amount of toluene (5 mL) and the solution was added into 200 mL methanol with stirring. The precipitates were collected and dried under reduced pressure at room temperature for 12 h. The gold nanoparticles stabilized with 1-octanethiol were thus obtained as black solids (0.20 g).

EXAMPLE 2

Preparation of Silver Nanoparticles with an Alkanethiol Stabilizer

Silver nanoparticles stabilized with n-octanethiol were prepared according to the procedure as described in Example 1 using silver nitrate (0.17 g, 1 mmol). A dark brown solid (0.18 g) was obtained after work-up.

EXAMPLE 3

Preparation of Gold Nanoparticles with Organophosphine Stabilizer

To a tetraoctylammonium bromide (1.60 g, 2.93 mmol) solution in toluene (50 mL) in a 500 mL flask was added hydrogen tetrachloroaurate (III) trihydrate (1.00 g, 2.54 mmol) solution in water (65 mL) with rapid stirring (under argon). After two minutes, triphenylphosphine (2.32 g, 8.85 mmol) was added to the flask and stirred vigorously for 10 min at room temperature. Then the solution was cooled to 0 degree C. by an ice-water bath. A freshly prepared sodium borohydride (1.41 g, 37.3 mmol) solution in water (10 mL) was added to the vigorously stirred solution over 30 seconds. The reaction mixture was allowed to warm to room temperature and the rapid stirring was continued for 3 h. The organic phase was washed with water 3 times, separated, dried over anhydrous magnesium sulfate, and filtered. The solvent was removed by evaporation (the bath temperature is <40° C.) to give a black solid. The solid was washed with hexane, saturated aqueous sodium nitrite, and methanol/water mixture (⅔ by volume). Further purification was conducted by precipitation from chloroform upon slow addition of pentane. The precipitates were collected and dried under reduced pressure at room temperature for 12 h. The gold nanoparticles stabilized with triphenylphosphine were thus obtained as black solids (0.17 g).

EXAMPLE 4

Preparation of Gold-Copper Nanoparticles with an Alkanethiol Stabilizer

To a tetraoctylammonium bromide (2.19 g, 4 mmol) solution in toluene (80 mL) in a 500 mL flask was added hydrogen tetrachloroaurate (III) trihydrate (0.197 g, 0.5 mmol) and copper(II) nitrate hemipentahydrate (0.116 g, 0.5 mmol) solution in water (100 mL) with rapid stirring (under argon). After two minutes, 1-octanethiol (0.439 g, 3 mmol) in toluene (30 mL) was added to the flask and stirred vigorously for 10 min at room temperature until the solution became colorless. Then the solution was cooled to 0° C. by an ice-water bath. A freshly prepared sodium borohydride (0.378 g, 10 mmol) solution in water (100 mL) was added to the vigorously stirred solution over 30 seconds. The reaction mixture was allowed to warm to room temperature and the rapid stirring was continued for 3 h. The organic phase was separated and concentrated to 5 mL by evaporation (the bath temperature is <40° C.). The concentrated solution was added drop-wise to 200 mL rapidly stirring methanol. The product was collected by centrifugation, washed with methanol several times, and vacuum dried. The solid was dissolved in a small amount of toluene (5 mL) and the solution was added into 200 mL methanol with stirring. The precipitates were collected and dried under reduced pressure at room temperature for 12 h. The gold-copper nanoparticles stabilized with 1-octanethiol were thus obtained as black solids (0.20 g)

EXAMPLE 5

Preparation of Conductive Thin Film and Conductivity Measurement

Gold nanoparticles synthesized in Example 1 were dispersed in toluene at a concentration of 3 percent by weight. Ultrasonic was applied to the mixture to help disperse the gold nanoparticles in toluene to form a homogeneous dispersion. The resulting mixture was passed through a 0.2 micron syringe filter. Thin films with a thickness about 30 nm were obtained by spin coating the above solution onto clean glass substrates at around 1000 rpm for 30 seconds at room temperature. Then the films were dried at room temperature in a vacuum oven for 2 hours to remove residual solvent. Conductivity of the film was measured by traditional 4-probe technique. After measurement, the thin films were heated to 150 degrees C. for 3 hours in vacuum oven to separate the stabilizer from the metal nanoparticles and to cause the metal nanoparticles to form electrically conductive layer or film.

After cooling down to room temperature, the conductivity of the resulting thin films was measured again. Before heating, the films showed conductivity in the range of $10^{-7}$ to $10^{-6}$ S/cm. After heating, conductivity of about 330 to 1000 S/cm was observed, an improvement about 8 to 10 orders. As a comparison, commercially available organic conductive material, poly(2,3-dihydrothieno[3,4-b]-1,4-dioxin) doped with poly(styrenesulfonate) (PEDOT/PSS), was spin coated onto the same glass substrate at the same speed for 100 seconds. After removing the residual solvent, conductivity of a 100 nm PEDOT/PSS thin film was measured to be 0.1 S/cm using the same technique.

EXAMPLE 6

Fabrication of the Source/Drain Electrodes of a Bottom-Contact TFT by Microcontact Printing A bottom-contact thin film transistor device, as schematically shown by FIG. 1, was chosen as the primary test device configuration in this Example. The test device was comprised of an n-doped silicon wafer with a thermally grown silicon oxide layer of a thickness of about 110 nanometers thereon. The wafer functioned as the gate electrode while the silicon oxide layer acted as the insulating layer and had a capacitance of about 32 nF/cm$^2$ (nanofarads/square centimeter). The fabrication of the device was accomplished under ambient conditions without any precautions being taken to exclude the materials and device from exposure to ambient oxygen, moisture, or light. The silicon wafer was first cleaned with oxygen plasma, isopropanol, air dried, and then immersed in a 0.1 M solution of octyltrichlorosilane in toluene for about 10 minutes at 60 degree C. Subsequently, the wafer was washed with toluene, isopropanol and air-dried.

Microcontact printing technique was used to deposit and pattern gold nanoparticles on the wafer with the aid of a polydimethylsiloxane (PDMS) stamp. The ink, composed of a dispersion of gold nanoparticles with a stabilizer of Example 1 in toluene (5 wt %), was spin coated onto the PDMS stamp at 1000 rpm. The inked PDMS stamp was first brought into contact with the top surface of the substrate and then gently pressed. After 1 minute, the stamp was released, leaving a series of gold nanoparticle lines on the substrate. Subsequently, the resultant gold nanoparticle lines were heated in a vacuum oven at 150 degrees C. for 3 hours. Before heating, the nanoparticle lines were dark in color. After heating, the lines became shining metallic gold color.

The following polythiophene was used to fabricate the semiconductor layer:

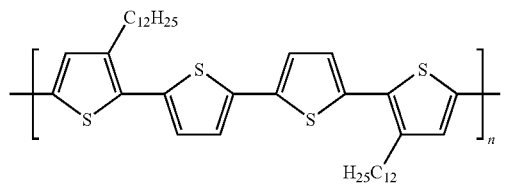

where n is a number of from about 5 to about 5,000. This polythiophene and its preparation are described in Beng Ong et al., US Patent Application Publication No. US 2003/0160230 A1, the disclosure of which is totally incorporated herein by reference. The semiconductor polythiophene layer of about 30 nanometers to about 100 nanometers in thickness was deposited on top of the device by spin coating of the polythiophene in dichlorobenzene solution at a speed of 1,000 rpm for about 100 seconds, and dried in vacuo at 80° C. for 20 hours.

The evaluation of field-effect transistor performance was accomplished in a black box at ambient conditions using a Keithley 4200 SCS semiconductor characterization system. The carrier mobility, μ, was calculated from the data in the saturated regime (gate voltage, $V_G$<source-drain voltage, $V_{SD}$) accordingly to equation (1)

$$I_{SD}=C_i\mu(W/2L)(V_G-V_T)^2 \qquad (1)$$

where $I_{SD}$ is the drain current at the saturated regime, W and L are, respectively, the semiconductor channel width and length, $C_i$ is the capacitance per unit area of the insulating layer, and $V_G$ and $V_T$ are, respectively, the gate voltage and threshold voltage. $V_T$ of the device was determined from the relationship between the square root of $I_{SD}$ at the saturated regime and $V_G$ of the device by extrapolating the measured data to $I_{SD}$=0. An important property for the thin film transistor is its current on/off ratio, which is the ratio of the saturation source-drain current when the gate voltage $V_G$ is equal to or greater than the drain voltage $V_D$ to the source-drain current when the gate voltage $V_G$ is zero.

The device of this Example showed very good output and transfer characteristics. The output characteristics showed no noticeable contact resistance, very good saturation behaviour, clear saturation currents which are quadratic to the gate bias. The device was turned on at around zero gate voltage with a sharp subthreshold slope. Mobility was calculated to be 0.0056 cm$^2$/V·s, and the current on/off ratio was more than 5 orders. The performance of the inventive device mimics a conventional bottom-contact TFT with gold electrodes fabricated by vacuum evaporation through a shadow mask.

EXAMPLE 7

Fabrication of the Source/Drain Electrodes of a Top-Contact TFT by Microcontact Printing A top-contact thin film transistor structure, as schematically shown by FIG. 3, was chosen to test an embodiment of the present invention. The inventive device was fabricated and evaluated using the procedures of Example 6 except as discussed herein. The substrate was prepared. Then, the semiconductor polythiophene layer of about 30 nanometers in thickness was spin coated on top of the silicon oxide layer. The coated semiconductor layer was dried in vacuum oven at 80 degrees C. for 3 hours and then cooled down to room temperature. The source and drain electrodes composed of the gold nanoparticle ink of Example 6 were deposited on top of the semiconductor layer by microcontact printing techniques in accordance with the procedure of Example 6. The resultant TFT device was dried at room temperature in vacuum for 1 hour, and then heated at 135 degrees C. for 3 hours to convert the gold nanoparticles into the conductive source and drain electrodes. The device showed similar performance as that described in Example 6. Little or no contact resistance was observed. The inventive device performance mimics a conventional top-contact TFT with gold electrodes fabricated by vacuum evaporation through a shadow mask.

EXAMPLE 8

Fabrication of the Source/Drain Electrodes of a Bottom-Contact TFT by Inkjet Printing A bottom-contact configuration as schematically shown by FIG. 1 was used. The inventive device was fabricated and evaluated using the procedures of Example 6 except as discussed herein. An inkjet printing technique was used to deposit the gold nanoparticle ink of Example 6. A modified piezoelectric inkjet printer equipped with an optical imaging system that allows alignment of the inkjet nozzles was used to deposit the gold nanoparticle ink. The gold nanoparticle ink was transferred into the cartridge of the inkjet printer. The ink was jetted onto the silicon oxide layer to form the source and drain electrodes. The device was dried at room temperature in vacuum for 1 hour, and then heated at 150 degrees C. for 3 hours. Subsequently, the semiconducting layer was deposited in accordance with the procedure as described in Example 6. The device showed similar performance as that described in Example 6. The inventive device performance mimics a conventional bottom-contact TFT with gold electrodes fabricated by vacuum evaporation through a shadow mask.

The invention claimed is:

1. A thin film transistor comprising:
   (a) an insulating layer;
   (b) a gate electrode;
   (c) a semiconductor layer;
   (d) a source electrode; and
   (e) a drain electrode, wherein the insulating layer, the gate electrode, the semiconductor layer, the source electrode, and the drain electrode are in any sequence as long as the gate electrode and the semiconductor layer both contact the insulating layer, and the source electrode and the drain electrode both contact the semiconductor layer, and wherein at least one of the source electrode, the drain electrode, and the gate electrode consist of coalesced metal nanoparticles and a residual amount of one or both of a stabilizer covalently bonded to the coalesced metal nanoparticles and a decomposed stabilizer covalently bonded to the coalesced metal nanoparticles, the nanoparticles containing Au or Ag.

2. The thin film transistor of claim 1 having an on/off ratio greater than about $10^2$.

3. The thin film transistor of claim 1, wherein the coalesced metal nanoparticles are a metal composite including Au or Ag.

4. The thin film transistor of claim 3, wherein the metal composite is Au—Ag, Au—Cu, Ag—Cu, Au—Ag—Cu, or Au—Ag—Pd.

* * * * *

UNITED STATES PATENT AND TRADEMARK OFFICE
CERTIFICATE OF CORRECTION

PATENT NO. : 7,612,374 B2
APPLICATION NO. : 11/954736
DATED : November 3, 2009
INVENTOR(S) : Yiliang Wu et al.

Page 1 of 1

It is certified that error appears in the above-identified patent and that said Letters Patent is hereby corrected as shown below:

In the Specification

Column 1, line 27 after "Cooperative Agreement No.", please delete "70NANBOH3033" and insert --70NANB0H3033--.

Signed and Sealed this
Third Day of September, 2013

Teresa Stanek Rea
*Acting Director of the United States Patent and Trademark Office*